(12) United States Patent
Zhitomirsky et al.

(10) Patent No.: US 11,596,946 B2
(45) Date of Patent: Mar. 7, 2023

(54) SEGMENTED TOP PLATE FOR VARIABLE DRIVING AND SHORT PROTECTION FOR DIGITAL MICROFLUIDICS

(71) Applicant: Nuclera Nucleics Ltd., Cambridge (GB)

(72) Inventors: David Zhitomirsky, Woburn, MA (US); Richard J. Paolini, Jr., Framingham, MA (US)

(73) Assignee: Nuclera Nucleics Ltd., Cambridge (GB)

( * ) Notice: Subject to any disclaimer, the term of this patent is extended or adjusted under 35 U.S.C. 154(b) by 152 days.

(21) Appl. No.: 17/239,875

(22) Filed: Apr. 26, 2021

(65) Prior Publication Data

US 2021/0331176 A1 Oct. 28, 2021

Related U.S. Application Data

(60) Provisional application No. 63/015,738, filed on Apr. 27, 2020.

(51) Int. Cl.
*B01L 3/00* (2006.01)
*H01L 27/12* (2006.01)

(52) U.S. Cl.
CPC ..... *B01L 3/502792* (2013.01); *B01L 2300/08* (2013.01); *B01L 2400/0427* (2013.01); *H01L 27/1214* (2013.01)

(58) Field of Classification Search
CPC ........... B01L 3/502792; B01L 2300/08; B01L 2400/0427; B01L 2200/0673;
(Continued)

(56) References Cited

U.S. PATENT DOCUMENTS 3,813,519 A 5/1974 Jochin et al.
5,311,337 A 5/1994 McCartney, Jr.
(Continued)

FOREIGN PATENT DOCUMENTS

JP 2013076739 A 4/2013
TW 200916823 A 4/2009
(Continued)

OTHER PUBLICATIONS

Abdelgawad, Mohamed et al., "The Digital Revolution: A New Paradigm for Microfluidics", Advanced Materials, vol. 21, pp. 920-925,(2009). Jan. 1, 2009.
(Continued)

*Primary Examiner* — Jennifer Wecker
*Assistant Examiner* — Oyeleye Alexander Alabi
(74) *Attorney, Agent, or Firm* — McCarter & English, LLP

(57) ABSTRACT

A digital microfluidic device, comprising a bottom plate and a top plate. The bottom plate comprises a bottom electrode array comprising a plurality of digital microfluidic propulsion electrodes. The top plate comprises a segmented top electrode array comprising a plurality of separately voltage addressable top electrode segments. Each top electrode segment and at least two of the propulsion electrodes of the bottom electrode array form a zone within the device. A controller is operatively coupled to the top electrode array and to the bottom electrode array and is configured to provide propulsion voltages between the top plate segment and the bottom plate propulsion electrodes of at least one of the zones. The top plate and the bottom plate are provided in a spaced relationship defining a microfluidic region therebetween.

20 Claims, 7 Drawing Sheets

(58) Field of Classification Search
CPC ..... B01L 2300/0645; B01L 2300/0816; B01L 3/502715; H01L 27/1214

See application file for complete search history.

(56) References Cited

U.S. PATENT DOCUMENTS

| | | |
|---|---|---|
| 5,828,429 A | 10/1998 | Takemura |
| 5,964,995 A | 10/1999 | Nikiforov et al. |
| 6,352,758 B1 | 3/2002 | Huang et al. |
| 6,565,727 B1 | 5/2003 | Shenderov |
| 6,759,680 B1 | 7/2004 | Takemura |
| 6,773,566 B2 | 8/2004 | Shenderov |
| 6,911,132 B2 | 6/2005 | Pamula et al. |
| 6,967,489 B2 | 11/2005 | Brooks et al. |
| 6,977,033 B2 | 12/2005 | Becker et al. |
| 7,052,244 B2 | 5/2006 | Fouillet et al. |
| 7,053,009 B2 | 5/2006 | Conley, Jr. et al. |
| 7,163,612 B2 | 1/2007 | Sterling et al. |
| 7,215,306 B2 | 5/2007 | Lo |
| 7,328,979 B2 | 2/2008 | Decre et al. |
| 7,420,549 B2 | 9/2008 | Jacobson et al. |
| 7,458,661 B2 | 12/2008 | Kim et al. |
| 7,504,709 B2 | 3/2009 | Masuda et al. |
| 7,531,072 B2 | 5/2009 | Roux et al. |
| 7,547,380 B2 | 6/2009 | Velev |
| 7,641,779 B2 | 1/2010 | Becker et al. |
| 7,733,559 B2 | 6/2010 | Kawase et al. |
| 7,767,069 B2 | 8/2010 | Lee et al. |
| 7,902,680 B2 | 3/2011 | Tano et al. |
| 7,976,795 B2 | 6/2011 | Zhou et al. |
| 8,093,064 B2 | 1/2012 | Shah et al. |
| 8,128,798 B2 | 3/2012 | Adachi et al. |
| 8,159,644 B2 | 4/2012 | Takatori |
| 8,173,000 B1 | 5/2012 | Hadwen et al. |
| 8,187,864 B2 | 5/2012 | Wheeler et al. |
| 8,319,759 B2 | 11/2012 | Jacobson et al. |
| 8,349,276 B2 | 1/2013 | Pamula et al. |
| 8,388,909 B2 | 3/2013 | Pollack et al. |
| 8,409,417 B2 | 4/2013 | Wu |
| 8,460,528 B2 | 6/2013 | Pollack et al. |
| 8,514,479 B2 | 8/2013 | Bae et al. |
| 8,525,966 B2 | 9/2013 | Takatori |
| 8,529,743 B2 | 9/2013 | Kim et al. |
| 8,547,111 B2 | 10/2013 | Hadwen et al. |
| 8,587,513 B2 | 11/2013 | Ozawa |
| 8,593,438 B2 | 11/2013 | Komatsu et al. |
| 8,603,413 B2 | 12/2013 | Fouillet |
| 8,653,832 B2 | 2/2014 | Hadwen et al. |
| 8,764,958 B2 | 7/2014 | Wang |
| 8,791,891 B2 | 7/2014 | Van Dijk et al. |
| 8,810,882 B2 | 8/2014 | Heikenfeld et al. |
| 8,815,070 B2 | 8/2014 | Wang et al. |
| 8,834,695 B2 | 9/2014 | Wang et al. |
| 8,858,772 B2 | 10/2014 | Crane et al. |
| 8,926,811 B2 | 1/2015 | Wu |
| 8,936,708 B2 | 1/2015 | Feiglin et al. |
| 8,940,147 B1 | 1/2015 | Bartsch et al. |
| 8,958,044 B2 | 2/2015 | Takatori |
| 8,993,348 B2 | 3/2015 | Wheeler et al. |
| 8,994,705 B2 | 3/2015 | Jacobson et al. |
| 9,061,262 B2 | 6/2015 | Vann et al. |
| 9,216,414 B2 | 12/2015 | Chu |
| 9,266,076 B2 | 2/2016 | Kim et al. |
| 9,458,489 B2 | 10/2016 | Lim et al. |
| 9,458,543 B2 | 10/2016 | Hadwen |
| 9,476,811 B2 | 10/2016 | Mudrik et al. |
| 9,594,056 B2 | 3/2017 | Fobel et al. |
| 9,610,582 B2 | 4/2017 | Kapur et al. |
| 9,623,407 B2 | 4/2017 | Delamarche et al. |
| 9,649,632 B2 | 5/2017 | Van Dam et al. |
| 9,714,463 B2 | 7/2017 | White et al. |
| 9,751,083 B2 | 9/2017 | Gao et al. |
| 9,815,056 B2 | 11/2017 | Wu et al. |
| 9,915,631 B2 | 3/2018 | Hoffmeyer et al. |
| 9,983,169 B2 | 5/2018 | Bramanti |
| 10,018,828 B2 | 7/2018 | Massard |
| 10,486,156 B2 | 11/2019 | Campbell et al. |
| 10,543,466 B2 | 1/2020 | Wu |
| 10,646,454 B2 | 5/2020 | Liu et al. |
| 10,882,042 B2 | 1/2021 | French |
| 2006/0039823 A1 | 2/2006 | Yamakawa et al. |
| 2007/0023292 A1 | 2/2007 | Kim et al. |
| 2008/0124252 A1 | 5/2008 | Marchand et al. |
| 2010/0032293 A1 | 2/2010 | Pollack et al. |
| 2010/0225611 A1 | 9/2010 | Lee et al. |
| 2012/0273702 A1 | 11/2012 | Culbertson et al. |
| 2013/0026040 A1 | 1/2013 | Cheng et al. |
| 2013/0143312 A1 | 6/2013 | Wheeler et al. |
| 2013/0161193 A1 | 6/2013 | Jacobs et al. |
| 2015/0158028 A1 | 6/2015 | Hadwen |
| 2015/0377831 A1 | 12/2015 | Wheeler et al. |
| 2016/0199832 A1 | 7/2016 | Jamshidi et al. |
| 2016/0312165 A1 | 10/2016 | Lowe, Jr. et al. |
| 2017/0072397 A1* | 3/2017 | Campbell ........ G01N 35/00871 |
| 2017/0315090 A1 | 11/2017 | Wheeler et al. |
| 2018/0246058 A1* | 8/2018 | Bramanti ........ G01N 27/44791 |
| 2019/0210026 A1 | 7/2019 | Jebrail et al. |
| 2020/0064705 A1 | 2/2020 | Kayal et al. |
| 2020/0089035 A1 | 3/2020 | Tsai et al. |
| 2020/0114135 A1 | 4/2020 | Paolini, Jr. et al. |
| 2020/0347840 A1 | 11/2020 | Paolini, Jr. et al. |
| 2020/0348576 A1 | 11/2020 | Visani et al. |

FOREIGN PATENT DOCUMENTS

| | | |
|---|---|---|
| WO | 2007120241 A2 | 10/2007 |
| WO | 2015/170268 A1 | 11/2015 |
| WO | 2017075295 A1 | 5/2017 |

OTHER PUBLICATIONS

Choi, Kihwan et al., "Digital Microfluidics", Annu. Rev. Anal. Chem. 5:413-40 (2012). Apr. 9, 2012.

Qi, Lin et al., "Mechanical-activated digital microfluidics with gradient surface wettability", Lab Chip, vol. 19, pp. 223-232,(2019). Dec. 4, 2019.

Subramanian, R. Shankar et al., "Motion of a Drop on a Solid Surface Due to a Wettability Gradient", Lanqmuir, vol. 12, pp. 11844-11849, (2005). Nov. 4, 2005.

Yu, Xi et al., "Surface Gradient Material: From Superhydrophobicity to Superhydrophilicity", Langmuir, vol. 22, pp. 4483-4486, (2006). Apr. 7, 2006.

Ito, Yoshihiro et al., "The Movement of a Water Droplet on a Gradient Surface Prepared by Photodegradation", Langmuir, vol. 23, pp. 1845-1850, (2007). Dec. 22, 2006.

Bhattacharjee, Biddut, "Study of Droplet Splitting in an Electrowetting Based Digital Microfluidic System", The University of British Columbia, Sep. 2012. Sep. 1, 2012.

Cho, Sung Kwon et al., "Creating, Transporting, Cutting, and Merging Liquid Droplets by Electrowetting-Based Actuation for Digital Microfluidic Circuits", Journal of Microelectromechanical Systems, vol. 12, No. 1, Feb. 2003. Feb. 1, 2003.

Nikapitiya, N. Y. Jagath B.et al., "Accurate, consistent, and fast droplet splitting and dispensing in electrowetting on dielectric digital microfluidics", Mirco and Nano Systems Letters, vol. 5, No. 24, Jun. 2017. Jun. 16, 2017.

Hadwen, B. et al., "Programmable large area digital microfluidic array with integrated droplet sensing for bioassays", Lab on a Chip, Issue 18, (2012). May 22, 2012.

Cooney, Christopher G. et al., "Electrowetting droplet microfluidics on a single planar surface", Microfluisics and Nanofluidics, vol. 2, Issue 5, pp. 435-446 (Sep. 2006). Sep. 1, 2006.

Fouillet, Y. et al., "EWOD Digital Microfluidics for Lab on a Chip", International Conference on Nanochannels, Microchannels, and Minichannels, Paper No. ICNMM2006-96020, pp. 1255-1264, (Sep. 2008). Sep. 15, 2008.

Nemani, Srinivasa Kartik et al., "Surface Modification of Polymers: Methods and Applications", Advanced Materials Interfaces, vol. 5, Issue 24, p. 1801247, Dec. 21, 2018. Dec. 21, 2018.

(56) References Cited

OTHER PUBLICATIONS

Hitzbleck, Martina et al., "Reagents in microfluidics: an 'in' and 'out' challenge", Chem. Soc. Rev., vol. 42, p. 8494, (2013). Mar. 27, 2013.
Walker, Shawn W. et al., "Modeling the Fluid Dynamics of Electro-Wetting On Dielectric (EWOD)", Journal of Microelectromechanical Systems, vol. 15, No. 4, pp. 986-1000, (Aug. 2006). Aug. 2006.
Li, Yiyan et al., "Improving the performance of electrowetting on dielectric microfluidics using piezoelectric top plate control", Sensors and Actuators B, vol. 229, pp. 63-74 (2016). 2016.
Barbulovic-Nad, Irena et al., "Digital microfluidics for cell-based assays", Lab Chip, vol. 8, pp. 519-526 (2008). Feb. 25, 2008.
Newman, Sharon et al., "High density DNA storage library via dehydration with digital microfluidic retrieval", Nature Communications, vol. 10, No. 1706 (2019). Apr. 12, 2019.
Dhindsa, Manjeet et al., "Virtual electrowetting channels: electronic liquid transport with continuous channel functionality", Lab on a Chip, Issue 7, pp. 832-836, (2010). Feb. 26, 2010.
Zulkepli et al., Droplet Velocity Measurement Based on Dielectric Layer Thickness Variation Using Digital Microfluidic Devices. Biosensors (Basel). May 8, 2018;8(2):45.
International Search Report and Written Opinion for Application No. PCT/US2021/029071, dated Aug. 9, 2021, 6 pages.

\* cited by examiner

Fan out connections for separate driving of top plate electrode array

SEGMENTED TOP PLATE FOR VARIABLE DRIVING AND SHORT PROTECTION FOR DIGITAL MICROFLUIDICS

RELATED APPLICATIONS

This application claims priority to U.S. Provisional Patent Application No. 63/015,738, filed Apr. 27, 2020, which is incorporated herein by reference. All patents and publications disclosed herein are incorporated by reference in their entireties.

BACKGROUND

Digital microfluidic devices use independent electrodes to propel, split, and join droplets in a confined environment, thereby providing a "lab-on-a-chip." Digital microfluidic devices are alternatively referred to as electrowetting on dielectric, or "EWoD," to further differentiate the method from competing microfluidic systems that rely on electrophoretic flow and/or micropumps. A 2012 review of the electrowetting technology was provided by Wheeler in "Digital Microfluidics," Annu. Rev. Anal. Chem. 2012, 5:413-40, which is incorporated herein by reference in its entirety. The technique allows sample preparation, assays, and synthetic chemistry to be performed with tiny quantities of both samples and reagents. In recent years, controlled droplet manipulation in microfluidic cells using electrowetting has become commercially-viable, and there are now products available from large life science companies, such as Oxford Nanopore.

Most of the literature reports on EWoD involve direct driving devices (a.k.a. "segmented" devices), whereby ten to twenty electrodes are directly driven with a controller. While segmented devices are easy to fabricate, the number of electrodes is limited by space and driving constraints. Accordingly, it is very difficult to perform massive parallel assays, reactions, etc., in direct drive devices. In comparison, "active matrix" devices (a.k.a. active matrix EWoD, a.k.a. AM-EWoD) devices can have many thousands, hundreds of thousands or even millions of addressable electrodes. The electrodes are typically switched by thin-film transistors (TFTs) and droplet motion is programmable with controllers so that AM-EWoD arrays can be used as general purpose devices that allow great freedom for controlling multiple droplets and executing simultaneous analytical processes.

Because of the need for higher performance, i.e., higher voltage driving and faster switching, most advanced AM-EWoD devices are constructed from polycrystalline silicon (a.k.a. polysilicon, a.k.a. poly-Si). However, polysilicon fabrication is substantially more expensive than amorphous silicon fabrication, i.e., the type used in mass-produced active matrix TFTs for the LCD display industry. For example, Sharp Life Sciences depends upon the improved functionality of polysilicon to achieve AM-EWoD devices that include propulsion, sensing, and heating capabilities on a single active matrix. See, e.g., U.S. Pat. Nos. 8,419,273, 8,547,111, 8,654,571, 8,828,336, 9,458,543, all of which are incorporated herein by reference in their entireties.

While poly-Si fabrication techniques allow implementation of complex AM-EWoD devices, the costs of poly-Si device production, combined with a global shortage of suitable fabrication facilities, has prevented the AM-EWoD technology from becoming widely available. There is a need for different designs that can take advantage of existing amorphous silicon fabrication capacity. Such devices could be produced at lower cost, and in great quantities, making them ideal for commonplace diagnostic testing, such as immunoassays.

SUMMARY OF INVENTION

The present application addresses the shortcomings of the prior art by providing an alternate architecture for a segmented top plate electrode. In one aspect, there is provided a digital microfluidic device, comprising a bottom plate and a top plate. The bottom plate includes a bottom electrode array comprising a plurality of digital microfluidic propulsion electrodes. A first dielectric layer covering the bottom electrode array. The top plate comprises a segmented top electrode array comprising a plurality of separately voltage addressable top electrode segments, wherein each top electrode segment and at least two of the bottom plate propulsion electrodes form a zone within the device. A second dielectric layer covers the top electrode array. The device also includes a controller operatively coupled to the top electrode array and to the bottom electrode array, wherein the controller is configured to provide propulsion voltages between the top plate segment and the bottom plate propulsion electrodes of at least one of the zones. The top plate and the bottom plate are provided in a spaced relationship defining a microfluidic region therebetween to permit droplet motion within the microfluidic region under application of propulsion voltages between the bottom electrode array and the segmented top electrode array.

In a second aspect, there is provided a method of driving a digital microfluidic system. The system includes: (a) a bottom plate array comprising: a transistor matrix, wherein each transistor of the matrix is operably connected to a gate line, a data line, and a propulsion electrode; a plurality of gate lines, wherein each gate line is operably connected to a gate driver; a plurality of data lines, wherein each data line is operably connected to a data driver; (b) a segmented top electrode array comprising a plurality of separately voltage addressable top electrode segments, wherein each top electrode segment and at least two of the bottom plate propulsion electrodes form a zone within the device; (c) a plurality of top segment drivers, wherein each driver is configured to separately address a top electrode segment; (d) a controller operably connected to the processing unit, the gate drivers, the data drivers, and the top segment drivers; (e) a processing unit operably programmed to perform a microfluidic driving method. The method includes: receiving input instructions in the processing unit, the input instructions relating to a droplet operation to be performed by the digital microfluidic system; outputting top electrode segment instructions from the processing unit to the controller; outputting a top electrode segment signal from the controller to the driver of a first top electrode segment, to drive the first segment to a first voltage differing from the second voltage of a second top electrode segment; outputting gate line and data line selecting instructions from the processing unit to the controller; outputting a gate line signal from the controller to the driver of a gate line, to drive the gate line, and outputting a data line signal from the controller to the driver of a data line, to drive the data line.

DEFINITIONS

Figure 1:
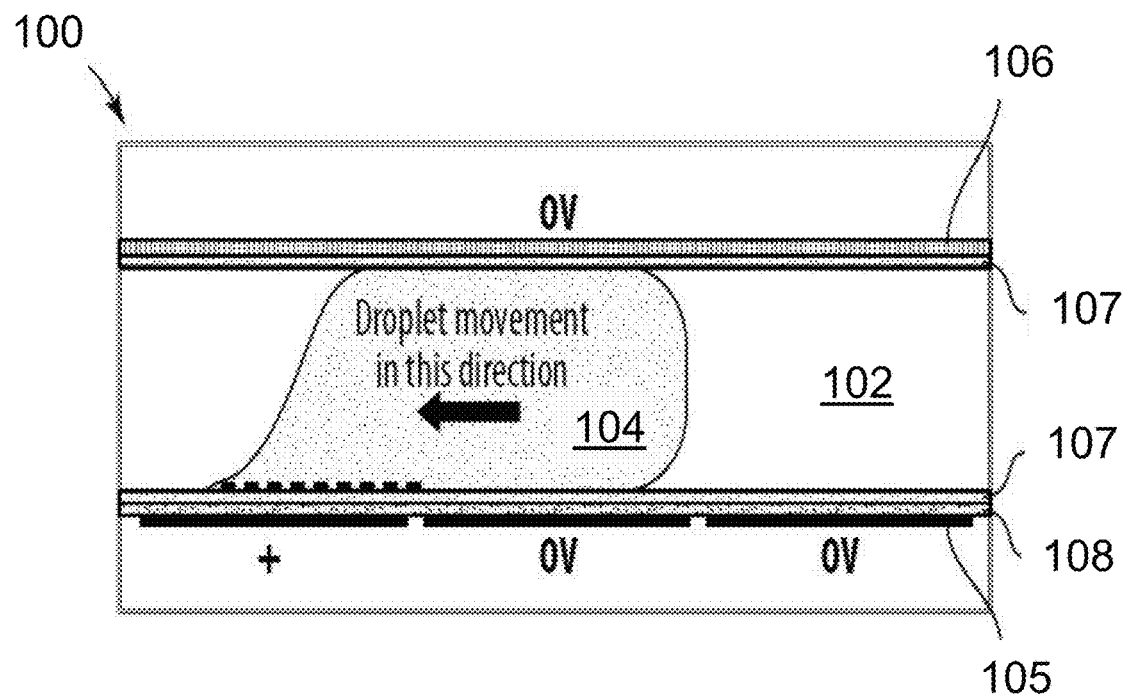
FIG. 1 shows a traditional microfluidic device including a common top electrode.

Unless otherwise noted, the following terms have the meanings indicated.

"Actuate" with reference to one or more electrodes means effecting a change in the electrical state of the one or more electrodes which, in the presence of a droplet, results in a manipulation of the droplet.

"Droplet" means a volume of liquid that electrowets a hydrophobic surface and is at least partially bounded by carrier fluid. For example, a droplet may be completely surrounded by carrier fluid or may be bounded by carrier fluid and one or more surfaces of an EWoD device. Droplets may take a wide variety of shapes; non-limiting examples include generally disc shaped, slug shaped, truncated sphere, ellipsoid, spherical, partially compressed sphere, hemispherical, ovoid, cylindrical, and various shapes formed during droplet operations, such as merging or splitting or formed as a result of contact of such shapes with one or more working surface of an EWoD device. Droplets may include typical polar fluids such as water, as is the case for aqueous or non-aqueous compositions, or may be mixtures or emulsions including aqueous and non-aqueous components. The specific composition of a droplet is of no particular relevance, provided that it electrowets a hydrophobic working surface. In various embodiments, a droplet may include a biological sample, such as whole blood, lymphatic fluid, serum, plasma, sweat, tear, saliva, sputum, cerebrospinal fluid, amniotic fluid, seminal fluid, vaginal excretion, serous fluid, synovial fluid, pericardial fluid, peritoneal fluid, pleural fluid, transudates, exudates, cystic fluid, bile, urine, gastric fluid, intestinal fluid, fecal samples, liquids containing single or multiple cells, liquids containing organelles, fluidized tissues, fluidized organisms, liquids containing multi-celled organisms, biological swabs and biological washes. Moreover, a droplet may include one or more reagent, such as water, deionized water, saline solutions, acidic solutions, basic solutions, detergent solutions and/or buffers. Other examples of droplet contents include reagents, such as a reagent for a biochemical protocol, a nucleic acid amplification protocol, an affinity-based assay protocol, an enzymatic assay protocol, a gene sequencing protocol, a protein sequencing protocol, and/or a protocol for analyses of biological fluids. Further example of reagents include those used in biochemical synthetic methods, such as a reagent for synthesizing oligonucleotides finding applications in molecular biology and medicine, and/or one more nucleic acid molecules. The oligonucleotides may contain natural or chemically modified bases and are most commonly used as antisense oligonucleotides, small interfering therapeutic RNAs (siRNA) and their bioactive conjugates, primers for DNA sequencing and amplification, probes for detecting complementary DNA or RNA via molecular hybridization, tools for the targeted introduction of mutations and restriction sites in the context of technologies for gene editing such as CRISPR-Cas9, and for the synthesis of artificial genes by "synthesizing and stitching together" DNA fragments.

"Droplet operation" means any manipulation of one or more droplets on a microfluidic device. A droplet operation may, for example, include: loading a droplet into the microfluidic device; dispensing one or more droplets from a source droplet; splitting, separating or dividing a droplet into two or more droplets; transporting a droplet from one location to another in any direction; merging or combining two or more droplets into a single droplet; diluting a droplet; mixing a droplet; agitating a droplet; deforming a droplet; retaining a droplet in position; incubating a droplet; heating a droplet; vaporizing a droplet; cooling a droplet; disposing of a droplet; transporting a droplet out of a microfluidic device; other droplet operations described herein; and/or any combination of the foregoing. The terms "merge," "merging," "combine," "combining" and the like are used to describe the creation of one droplet from two or more droplets. It should be understood that when such a term is used in reference to two or more droplets, any combination of droplet operations that are sufficient to result in the combination of the two or more droplets into one droplet may be used. For example, "merging droplet A with droplet B," can be achieved by transporting droplet A into contact with a stationary droplet B, transporting droplet B into contact with a stationary droplet A, or transporting droplets A and B into contact with each other. The terms "splitting," "separating" and "dividing" are not intended to imply any particular outcome with respect to volume of the resulting droplets (i.e., the volume of the resulting droplets can be the same or different) or number of resulting droplets (the number of resulting droplets may be 2, 3, 4, 5 or more). The term "mixing" refers to droplet operations which result in more homogenous distribution of one or more components within a droplet. Examples of "loading" droplet operations include microdialysis loading, pressure assisted loading, robotic loading, passive loading, and pipette loading. Droplet operations may be electrode-mediated. In some cases, droplet operations are further facilitated by the use of hydrophilic and/or hydrophobic regions on surfaces and/or by physical obstacles.

"Gate driver" is a power amplifier that accepts a low-power input from a controller, for instance a microcontroller integrated circuit (IC), and produces a high-current drive input for the gate of a high-power transistor such as a TFT. "Source driver" is a power amplifier producing a high-current drive input for the source of a high-power transistor. "Top segment driver" is a power amplifier producing a drive input for a top plane electrode segment of an EWoD device.

"Nucleic acid molecule" is the overall name for DNA or RNA, either single- or double-stranded, sense or antisense. Such molecules are composed of nucleotides, which are the monomers made of three moieties: a 5-carbon sugar, a phosphate group and a nitrogenous base. If the sugar is a ribosyl, the polymer is RNA (ribonucleic acid); if the sugar is derived from ribose as deoxyribose, the polymer is DNA (deoxyribonucleic acid). Nucleic acid molecules vary in length, ranging from oligonucleotides of about 10 to 25 nucleotides which are commonly used in genetic testing, research, and forensics, to relatively long or very long prokaryotic and eukaryotic genes having sequences in the order of 1,000, 10,000 nucleotides or more. Their nucleotide residues may either be all naturally occurring or at least in part chemically modified, for example to slow down in vivo degradation. Modifications may be made to the molecule backbone, e.g. by introducing nucleoside organothiophosphate (PS) nucleotide residues. Another modification that is useful for medical applications of nucleic acid molecules is 2' sugar modifications. Modifying the 2' position sugar is believed to increase the effectiveness of therapeutic oligonucleotides by enhancing their target binding capabilities, specifically in antisense oligonucleotides therapies. Two of the most commonly used modifications are 2'-O-methyl and the 2'-Fluoro.

When a liquid in any form (e.g., a droplet or a continuous body, whether moving or stationary) is described as being "on", "at", or "over an electrode, array, matrix or surface, such liquid could be either in direct contact with the electrode/array/matrix/surface, or could be in contact with one or more layers or films that are interposed between the liquid and the electrode/array/matrix/surface.

When a droplet is described as being "on" or "loaded on" a microfluidic device, it should be understood that the droplet is arranged on the device in a manner which facilitates using the device to conduct one or more droplet operations on the droplet, the droplet is arranged on the device in a manner which facilitates sensing of a property of or a signal from the droplet, and/or the droplet has been subjected to a droplet operation on the droplet actuator.

"Each," when used in reference to a plurality of items, is intended to identify an individual item in the collection but does not necessarily refer to every item in the collection. Exceptions can occur if explicit disclosure or context clearly dictates otherwise.

DETAILED DESCRIPTION

As indicated above, the present application provides a digital microfluidic device including a segmented top plate and a bottom plate defining a microfluidic region. Traditional devices feature a top plate with a single continuous electrode, allowing for only one potential to be set for the top plate. As a result, propulsion electrodes that require a different voltage than their neighbors can only rely on their respective bottom plate electrode potentials for this purpose. Moreover, a defect encountered in the course of a droplet operation may induce current flows which force the top plate potential to change, thereby affecting all the pixels in the array. In such instances, a microfluidic device and/or a microfluidic operation may be ruined by only a few defects in a bottom array of propulsion electrodes.

As depicted herein, a bottom plate is fitted with an array of elements, where each element includes a digital microfluidic actuation electrode, to propel various droplets through the microfluidic region. The segmented top plate of this aspect of the invention includes a top electrode array partitioned into two or more separately voltage addressable segments. Circuitry coupled to the top electrode segments allows for each segment of the tope electrode array to be driven independently from the others. Each segment and a subset of at least two elements of the bottom plate array form a zone including the segment, the propulsion electrodes of the elements in the subset, and the space there between. Typically, each segment forms a respective zone together with the propulsion electrodes of propulsion electrodes (a.k.a., pixels) directly across from it on the bottom plate, thereby including an area of the bottom electrode surface that is symmetrical to the shape of the segment and directly opposite thereto. This novel architecture allows for multiple top plane potentials to be set independently in different zones of the device. Multiple simultaneous voltage ranges may be achieved on neighboring pixels, a functionality beneficial for driving different types of droplets or different types of functional zones, for instance reservoirs vs. main array pixels. Moreover, defects formed during operation of the device may be isolated by switching a particular zone off, thereby containing the damage and allowing the remainder of the device to continue operating. In instances where top plane switching is used, non-active parts of device may be switched completely off to minimize wear and preserve device performance.

The number of top electrode segments in a device can vary to provide the number of zones required by the application at hand, and the characteristics of each zone may be tailored to suit particular droplet formulations and operating voltages. A device may feature any from just two to ten or more segmented top electrode zones, for example to accommodate instances where several reactants are introduced as separate droplets from a number of reservoirs on the plate periphery. Similarly, the number and density of bottom plate propulsion electrodes in a given zone can fall within several different ranges, depending on factors such as the area of the zone and its electrode density, which may be constant or differing at various locations on the bottom plate. For example, a zone having an area of 1 in$^2$ and a bottom plate electrode density resolution of 100 PPI will encompass 10,000 propulsion electrodes. The same area at a higher resolution, for example 200 PPI or more, will result in a zone having 40,000 or more propulsion electrodes.

The use of "top" and "bottom" is merely a convention as the locations of the two plates can be switched, and the devices can be oriented in a variety of ways, for example, the top and bottom plates can be roughly parallel while the overall device is oriented so that the plates are normal to a work surface (as opposed to parallel to the work surface as shown in the figures). The top or the bottom plates may include additional functionalities, such as heating by commercial micro-heaters and thermocouples that are integrated with the microfluidic platform and/or temperature sensing.

In a representative embodiment, the bottom plate of the device includes an active matrix electrowetting on dielectric (AM-EWoD) device featuring a plurality of array elements, each array element including a propulsion electrode, although other configurations for driving the bottom plate electrodes are also contemplated. The AM-EWoD matrix may be in the form of a transistor active matrix backplane, for example a thin film transistor (TFT) backplane where each propulsion electrode is operably attached to a transistor and capacitor actively maintaining the electrode state while the electrodes of other array elements are being addressed. Top electrode circuitry independently drives each of the segments of the top plate.

A propulsion voltage is defined by a voltage difference between an array electrode and the top electrode segment directly opposed to it across the microfluidic region. By adjusting the frequency and amplitude of the signals driving the array electrodes and top electrode segments, the propulsion voltage of each pixel of the array may be controlled to operate the AM-EWoD device at different modes of operation in accordance with different droplet manipulation operations to be performed. In one embodiment, the TFT array may be implemented with amorphous silicon (a-Si), thereby reducing the cost of production to the point that the devices can be disposable.

The fundamental operation of a traditional EWoD device is illustrated in the sectional image of FIG. 1. The EWoD 100 includes microfluidic region filled with an oil 102 and at least one aqueous droplet 104. The microfluidic region gap depends on the size of droplets to be handled and is typically in the range 50 to 200 µm, but the gap can be larger. In a basic configuration, as shown in FIG. 1, a plurality of propulsion electrodes 105 are disposed on one substrate and a singular top electrode 106 is disposed on the opposing surface. The device additionally includes hydrophobic coatings 107 on the top and bottom surfaces, i.e., where they contact the oil layer, in addition to a dielectric layer 108 between the propulsion electrodes 105 and the hydrophobic coating 107. (The upper substrate may also include a dielectric layer, but it is not shown in FIG. 1). The hydrophobic layer prevents the aqueous droplet from wetting the surface. When no voltage differential is applied between adjacent electrodes, the droplet will maintain a spheroidal shape to minimize contact with the hydrophobic surfaces (oil and hydrophobic layer). Because the droplets do not wet the surface, they are less likely to contaminate the surface or interact with other droplets except when that behavior is desired.

While it is possible to have a single layer for both the dielectric and hydrophobic functions, such layers typically require thick inorganic layers (to prevent pinholes) with resulting low dielectric constants, thereby requiring more than 100V for droplet movement. To achieve low voltage propulsion, it is often better to have a thin inorganic layer for high capacitance and to be pinhole free, topped by a thin organic hydrophobic layer. With this combination it is possible to have electrowetting operation with voltages in the range +/−10 to +/−50V, which is in the range that can be supplied by conventional TFT arrays built upon amorphous silicon.

Hydrophobic layers may be manufactured from hydrophobic materials formed into coatings by deposition onto a surface via suitable techniques. Depending on the hydrophobic material to be applied, example deposition techniques include spin coating, molecular vapor deposition, and chemical vapor deposition. Hydrophobic layers may be more or less wettable as usually defined by their respective contact angles. Unless otherwise specified, angles are herein measured in degrees)(° or radians (rad), according to context. For the purpose of measuring the hydrophobicity of a surface, the term "contact angle" is understood to refer to the contact angle of the surface in relation to deionized (DI) water. If water has a contact angle between $0°<\theta<90°$, then the surface is classed as hydrophilic, whereas a surface producing a contact angle between $90°<\theta<180°$ is considered hydrophobic. Usually, moderate contact angles are considered to fall in the range from about 90° to about 120°, while high contact angles are typically considered to fall in the range from about 120° to about 150°. In instances where the contact angle is $150°<\theta$ then the surface is commonly known as superhydrophobic or ultrahydrophobic. Surface wettabilities may be measured by analytical methods well known in the art, for instance by dispensing a droplet on the surface and performing contact angle measurements using a contact angle goniometer. Anisotropic hydrophobicity may be examined by tilting substrates with gradient surface wettability along the transverse axis of the pattern and examining the minimal tilting angle that can move a droplet.

Hydrophobic layers of moderate contact angle typically include one or a blend of fluoropolymers, such as PTFE (polytetrafluoroethylene), FEP (fluorinated ethylene propylene), PVF (polyvinylfluoride), PVDF (polyvinylidene fluoride), PCTFE (polychlorotrifluoroethylene), PFA (perfluoroalkoxy polymer), FEP (fluorinated ethylenepropylene), ETFE (polyethylenetetrafluoroethylene), and ECTFE (polyethylenechlorotrifluoroethylene). Commercially available fluoropolymers include Cytop® (AGC Chemicals, Exton, Pa.) and Teflon® AF (Chemours, Wilmington, Del.). An advantage of fluoropolymer films is that they can be highly inert and can remain hydrophobic even after exposure to oxidizing treatments such as corona treatment and plasma oxidation.

When a voltage differential is applied between adjacent electrodes, the voltage on one electrode attracts opposite charges in the droplet at the dielectric-to-droplet interface, and the droplet moves toward this electrode, also as illustrated in FIG. 1. The voltages needed for acceptable droplet propulsion depend on the properties of the dielectric and hydrophobic layers. AC driving is used to reduce degradation of the droplets, dielectrics, and electrodes by various electrochemistries. Operational frequencies for EWoD can be in the range 100 Hz to 1 MHz, but lower frequencies of 1 kHz or lower are preferred for use with TFTs that have limited speed of operation.

Figure 3:
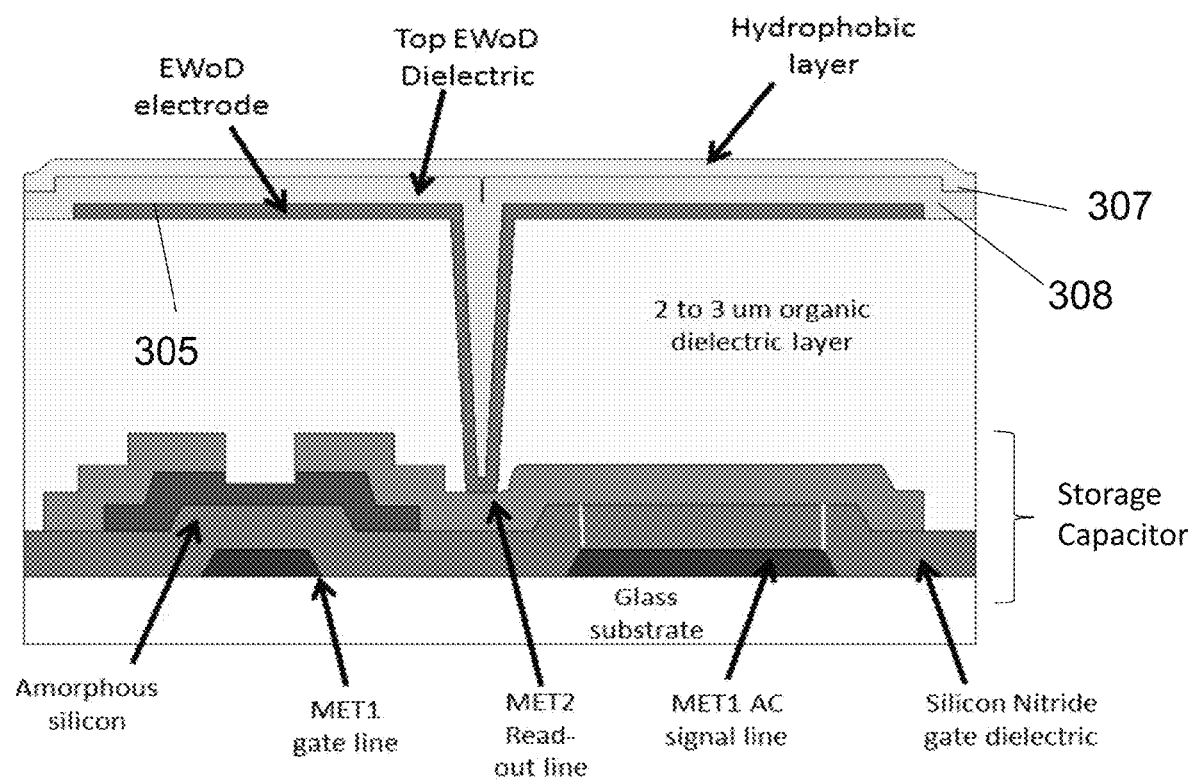
FIG. 3 is a schematic diagram of a portion of a AM-EWoD array, including a propulsion electrode, a thin film transistor, a storage capacitor, a dielectric layer, and a hydrophobic layer.

Returning to FIG. 1, the top electrode 106 is a single conducting layer normally set to zero volts or a common voltage value (VCOM) to take into account offset voltages on the propulsion electrodes 105 due to capacitive kickback from the TFTs that are used to switch the voltage on the electrodes (see FIG. 3). The top electrode can also have a square wave applied to increase the voltage across the liquid. Such an arrangement allows lower propulsion voltages to be used for the TFT connected propulsion electrodes 105 because the top plate voltage 106 is additional to the voltage supplied by the TFT. In many instances, the top electrode is constructed from a light-transmissive material, such as indium tin oxide (ITO) sputtered on a film of polyethylene terephthalate (PET), however, the top electrode does not have to be light-transmissive for most electrowetting on dielectric applications. Other simple conductive films, such as metal films, may be used, provided that they are sufficiently protected from the materials of the droplet layer, e.g., the oil and the aqueous droplet.

Figure 2:
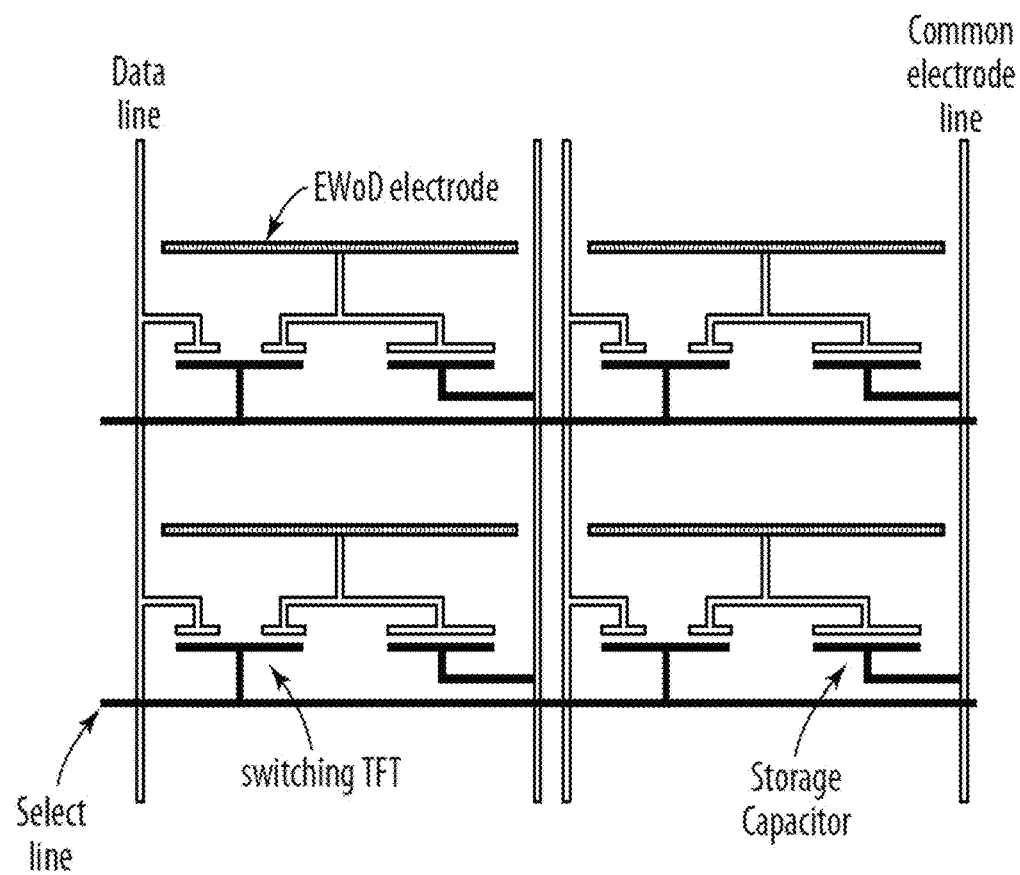
FIG. 2 is a schematic diagram of a TFT architecture for a plurality of propulsion electrodes of an EWoD device.

As illustrated in FIG. 2, an active matrix of propulsion electrodes can be arranged to be driven with data and gate (select) lines much like an active matrix in a liquid crystal display. The gate (select) lines are scanned for line-at-a time addressing, while the data lines carry the voltage to be transferred to propulsion electrodes for electrowetting operation. If no movement is needed, or if a droplet is meant to move away from a propulsion electrode, then 0V will be applied to that (non-target) propulsion electrode. If a droplet is meant to move toward a propulsion electrode, an AC voltage will be applied to that (target) propulsion electrode.

The architecture of an amorphous silicon, TFT-switched, propulsion electrode is shown in FIG. 3. The dielectric 308 must be thin enough and have a dielectric constant compatible with low voltage AC driving, such as available from conventional image controllers for LCD displays. For example, the dielectric layer may comprise a layer of approximately 20-40 nm $SiO_2$ over-coated with 200-400 nm plasma-deposited silicon nitride. Alternatively, the dielectric may comprise atomic-layer-deposited $Al_2O_3$ between 2 and 100 nm thick, preferably between 20 and 60 nm thick. The TFT may be constructed by creating alternating layers of differently-doped a-Si structures along with various electrode lines, with methods known to those of skill in the art. The hydrophobic layer 307 can be constructed from materials such as Teflon® AF (Sigma-Aldrich, Milwaukee, Wis.) and FlurorPel™ coatings from Cytonix (Beltsville, Md.), which can be spin coated over the dielectric layer 308.

Figure 4:
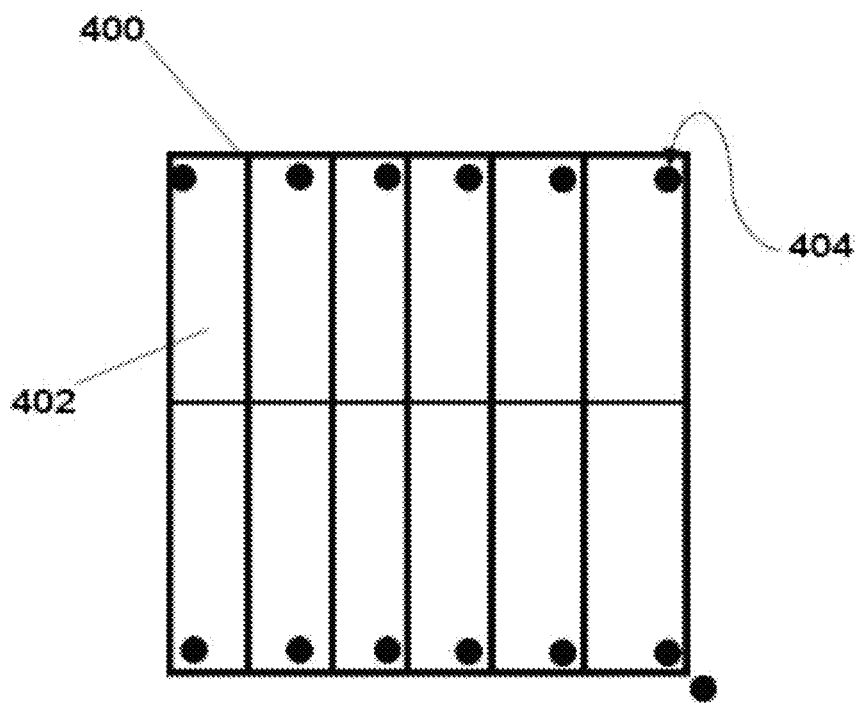
FIG. 4 is a schematic illustration of a segmented top electrode array.

As anticipated above, the novel device of this aspect of the invention features a top electrode array partitioned into a plurality of elements, where each element includes a voltage addressable segment. FIG. 4 is a schematic illustration of a segmented top electrode array 400 which may be manufactured from a transparent conducting material partitioned into a plurality of strips 402. (Again, the conducting material need not be transparent for electrowetting applications. It does make it easier to assess the progress of the various processes taking place on the device, however.) Each strip is separate voltage addressable and is connected to the bottom plane by circuitry contacting the strip at contact point 404. A small gap spacing is interposed between adjacent electrode segments to insulate the segments from each other. To avoid discontinuities where propulsion electrodes might lack a corresponding top plane electrode segment located directly overhead, the gap spacing is preferably smaller than the electrode size on the bottom plate array. Optionally, the gap spacing may be lined with an electrically insulator substance, the sidewalls of the strips may be covered with an insulator coating, or both.

Figure 5:
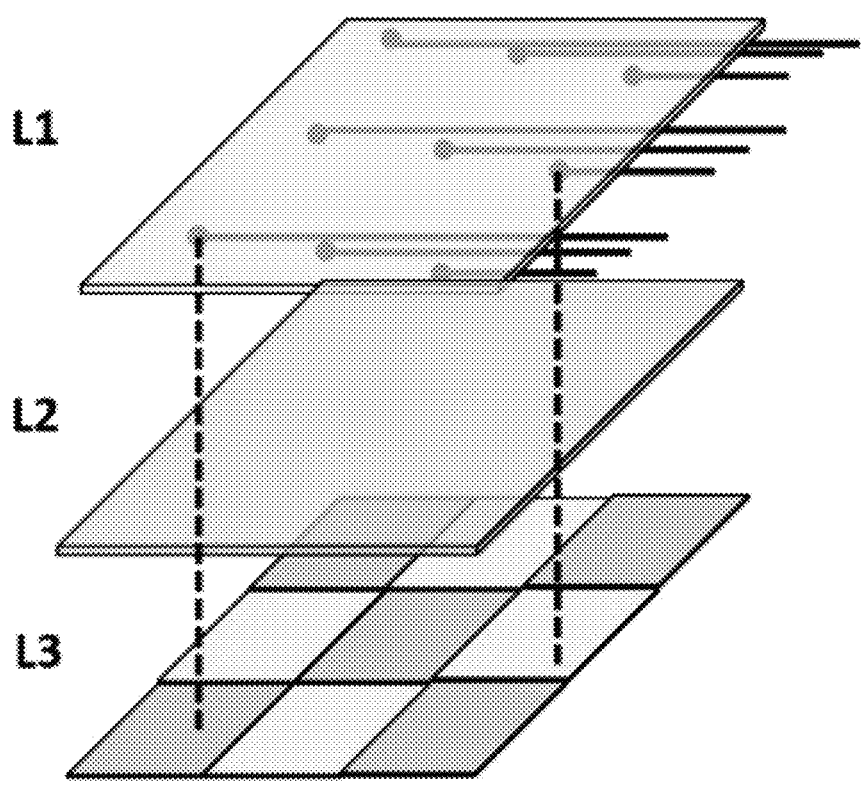
FIG. 5 is a schematic illustration of a multi-layered, segmented top electrode array.

The top electrode array design may rely on standard transparent conducting materials that are well-known in the art, such as indium-doped tin oxide (ITO), fluorine-doped zinc oxide or titanium dioxide to achieve a segmented top electrode layer. It is possible to extend the design to two or more layers, for example by combining the segmented electrode layer with a trace layer. In the representative embodiment schematically illustrated in FIG. 5, L1 depicts traces laid on a first insulating substrate, followed by intermediate insulating layer L2, and via connections made to segmented top electrode layer L3. The materials of L3 may be chosen from among the standard transparent conducting materials listed above, and typically come into contact with droplets in the microfluidic region between the top and bottom plates. Typically, the bottom surface of L3 is coated with a hydrophobic layer to prevent direct contact between the electrodes and liquids or gases in the microfluidic region.

Layer L2 may be an insulator material, produced by a vacuum deposition technique, of which there are several types including physical vapor deposition (PVD) and chemical vapor deposition (CVD) in one of its variants: low-pressure chemical vapor deposition (LPCVD), plasma-enhanced chemical vapor deposition (PECVD), and plasma-assisted CVD (PACVD). In several instances, a combination of PVD and CVD are used in the same or connected processing chambers. In one exemplary embodiment, the insulator material is parylene, the name for a variety of chemical vapor deposited poly(p-xylyene) polymers used as moisture and dielectric barriers. Among them, Parylene C, bearing one chlorine atom substituent to the phenyl moiety per repeat polymeric unit, is the most popular due to its combination of barrier properties, cost, and other processing advantages. Parylene N and C have a low degree crystallinity and are therefore usually suitable as optical materials. Other optically transparent or at least partially transparent polymeric and ceramic insulators may also be used.

In digital microfluidic devices with sensors built into the bottom plate array, for example as disclosed in U.S. Pat. No. 8,828,336 to Hadwen et al., such that requirements on optical detection are relaxed, more conventional materials may be used for L1, for example glass-reinforced epoxy laminate materials such as FR-4, other epoxy-based materials, and semiconductors. For L2, non-transparent polymers and ceramics may be used, and L3 may be an electrode grid composed of oxidation-resistant metals and alloys, for instance gold, platinum, or nickel-chrome (NiCr), or highly doped semiconductor materials.

Figure 6:
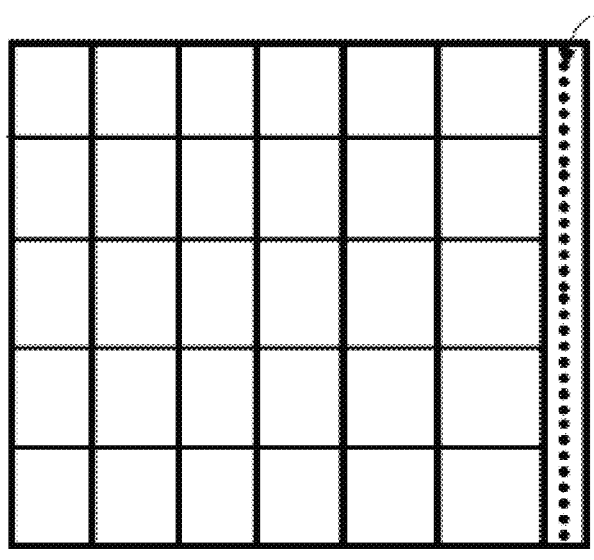
FIG. 6 is a schematic illustration of a top plate electrode array fitted with connectors from the fan out on the edge.

Circuitry for connecting and/or controlling the voltages of the top plate segments may be housed in the top plate itself, in the bottom plate, for example on the edges of the electrode array, or elsewhere in the device depending on the needs and constraints of the application at hand. In one embodiment, the connections to the top electrode array are housed in the top plate with a separate connector. In another embodiment, the device is fitted with a connection interface with the bottom electrode array, for example connectors from the fan out on the edge, as illustrated in FIG. 6. In this instance, filled vias are made in the top electrode segments and are fanned out to a location where a connection can be made. For more complex designs, the top plate electrode may comprise two or more layers, thereby allowing for various geometries such as square, hexagonal, or triangular formed with top electrode segment arrays that can be independently addressed.

Figure 7:
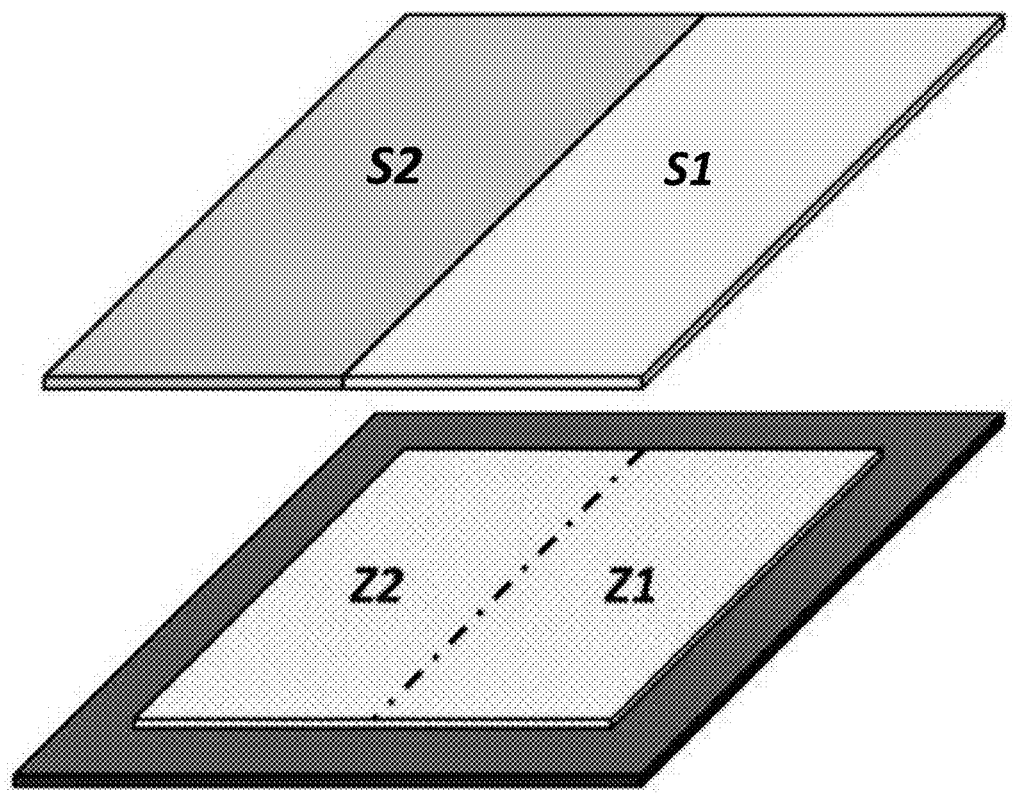
FIG. 7 illustrates a top electrode array including two segments, each segment defining a zone within the microfluidic device.
Figure 8:
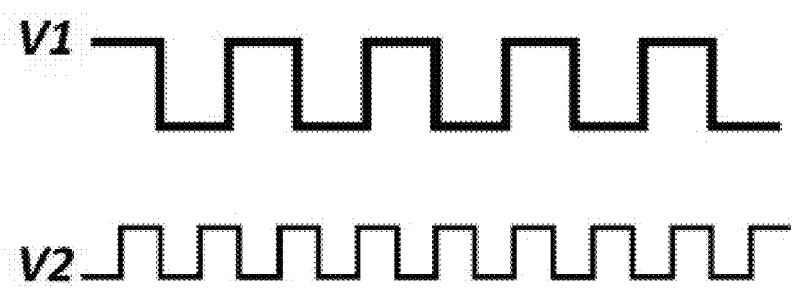
FIG. 8 illustrates exemplary pulse sequences driven between the electrodes of FIG. 7.

In the basic design schematically illustrated in FIG. 7, the top electrode array is composed of two segments labeled S1 and S2, respectively. Segment S1 overlays the bottom layer pixels of zone Z1 and is driven at a voltage VS1, while segment S2 is above those of zone Z2 and is driven at a voltage VS2. One or more of the bottom plate electrodes in zone Z1 are driven at a voltage V1 while one or more of the bottom plate electrodes in zone Z2 are driven at a voltage V2. The voltages may be measured with respect to the common ground of the bottom plate array. As illustrated in the pulse sequences of FIG. 8, the electrodes of Z1 may be driven at an AC potential V1=VS1−VZ1 between lower threshold voltage −V3 to upper limit +V3 at a frequency of 20 Hz, whereas zone Z2 electrodes may be driven at AC potential V2=VS2−VZ2 between lower and upper threshold voltages −V4 to +V4. In operation, zones Z1 and Z2 may have differing driving requirements, either in polarity, amplitude, or frequency, for example to achieve differing electrowetting forces in separate parts of the bottom plate. Accordingly, each of VS1, VS2, VZ1, and VZ2 may be adjusted independently to suit such requirements, and each may be a DC potential or a time-varying AC potential. It is also possible to ground S1 and Z1 to 0V, thus requiring no driving of these electrodes, whereas in a traditional device having a single top electrode, if the pixels of Z2 were to be active, a voltage would need to be applied to the pixels of Z1 to match the voltage of the top plate in order to keep the overall voltage difference equal to 0V for the electrodes of Z1. In some embodiments, the controller is configured to "turn off" a zone by taking the top and bottom electrodes to 0V to prevent further damage to this area or to assure that droplets undergoing processes on other areas of the device are not routed into this area. For example, if there are a number of failed propulsion electrodes in the zone beyond a predetermined amount, e.g., greater than 1%, e.g., greater than 2%, e.g., greater than 5%, e.g., greater than 10%, the controller will turn off that zone.

Figure 9:
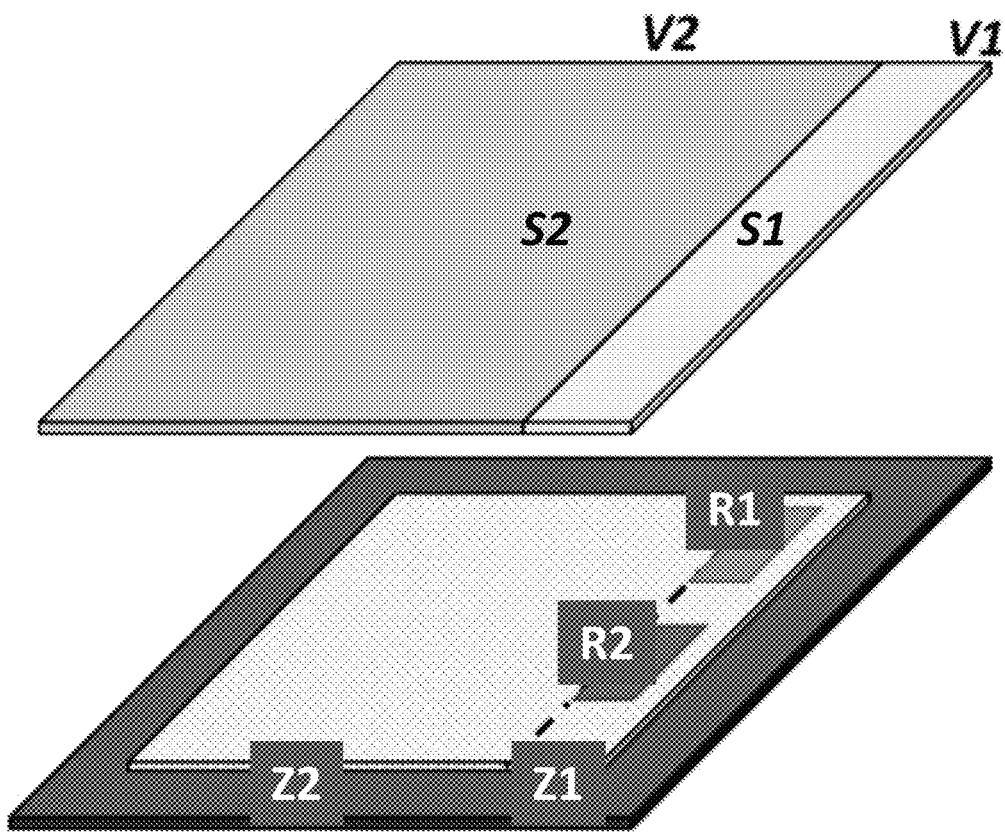
FIG. 9 illustrates a configuration including a reservoir zone and a standard actuation zone.

It has been known in the art that relatively thin dielectrics subjected to repeated low voltage actuation have a tendency to be more susceptible to failure than thicker dielectrics at higher voltages. (Sensors & Actuators B: 2012 October; 173: 338-345). The present application addresses this problem with the configuration schematically illustrated in FIG. 9, where Z1 is a "reservoir zone" including reservoirs R1 and R2 while Z2 includes standard actuation electrodes. This configuration may include a TFT backplane for the Z2 electrodes, and either the same TFT backplane for the Z1 electrodes or customized direct drive electrodes. The top plate is segmented such that a first voltage V1 may be applied to opposite to zone Z1 and a second voltage V2 to zone Z2, independently.

In one example embodiment of this aspect, Z1 is made operate at higher voltages than Z2. To this end, dielectrics having different thicknesses may be deposited on different zones of the device surfaces, thereby covering Z1 with a thicker dielectric layer capable of withstanding higher voltages. By employing a combination of thicker dielectric with higher voltages, this design is able to greatly reduce the strain on dispensing zones that undergo many dispensing cycles, thus reducing their likelihood of failure. This approach may be further extended to allow for any number of zones, each zone having its specific voltage and dielectric thickness depending on whether a given zone requires more or fewer actuation cycles. In addition, TFT arrays are usually best suited to operate at low voltage ranges, so the design of this embodiment allows to restrict high voltage operation to specific zones, thereby minimizing wear on the rest of an array.

Figure 10:
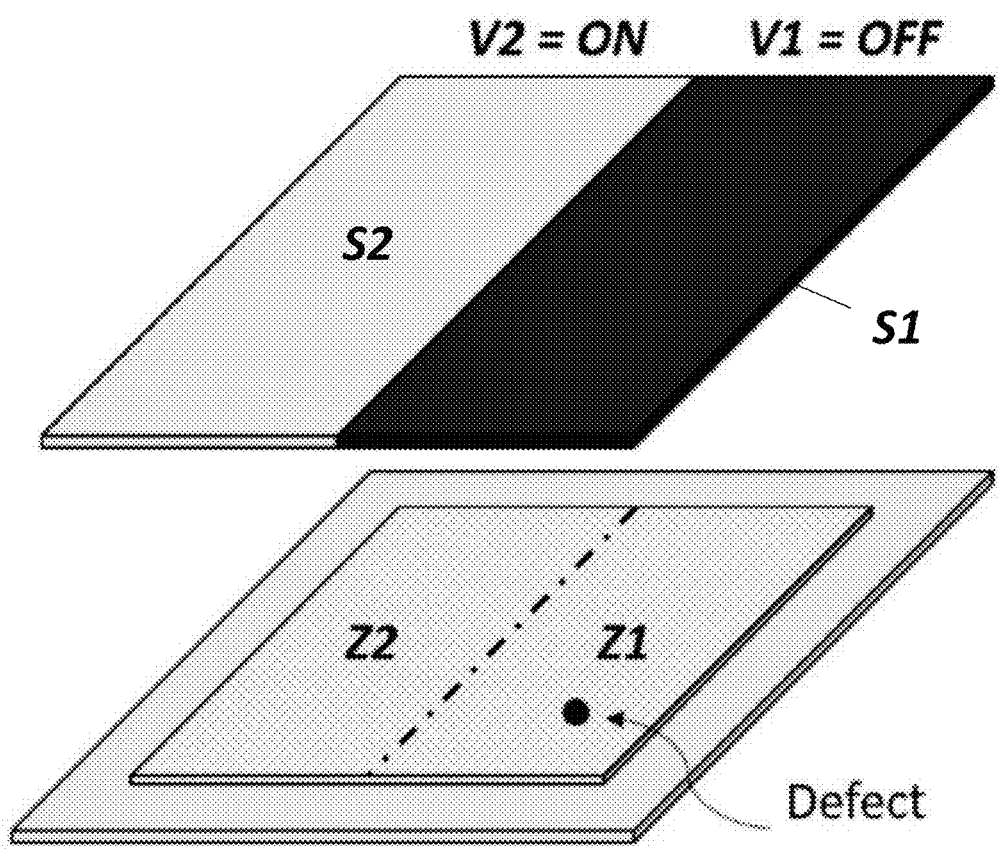
FIG. 10 illustrates an approach for turning off damaged zones in the device of FIG. 7.

When in operation, the dielectric stack of the bottom plate may experience a catastrophic failure that may impact the voltage of the top electrode in instances where the defect creates an electrical connection between the top and bottom plates. In devices featuring a segmented top plate, if the impacted zone is no longer in operating condition, it may be turned off, and will not affect the functioning of other zones free of defects. This approach is schematically illustrated in FIG. 10, where the top plate segment S1 is turned off, leaving Z2 unaffected by the damage. In one embodiment, if the area of the bottom electrode array is labeled as "A", and the defect density is denoted as "x", the number of zones needed to guarantee at least one operable zone is equal to Ax+1. Therefore, the bottom plate electrode array may be subdivided into zones of area A/(Ax+1), assuming the defects force an entire zone to be inoperable. In a representative embodiment, the defect density threshold for turning off a zone may be set, for example, at about 25 defects per $cm^2$, which translates to approximately 1 defect per 10×10 pixel droplet.

It is also possible to establish a metric "F" which represents the operable area fraction of the array area A. In this instance, the required number of segments will be: x/(1−F)*A, where x is the defect density as set out above. For example, if the defect density is equal to 2 defects per cm', the number of segments required for 50% guaranteed operation on a 20 $cm^2$ electrode array is equal to 80 in the worst case scenario. However, depending on the statistical clustering of defects, this number might be lower.

Figure 11:
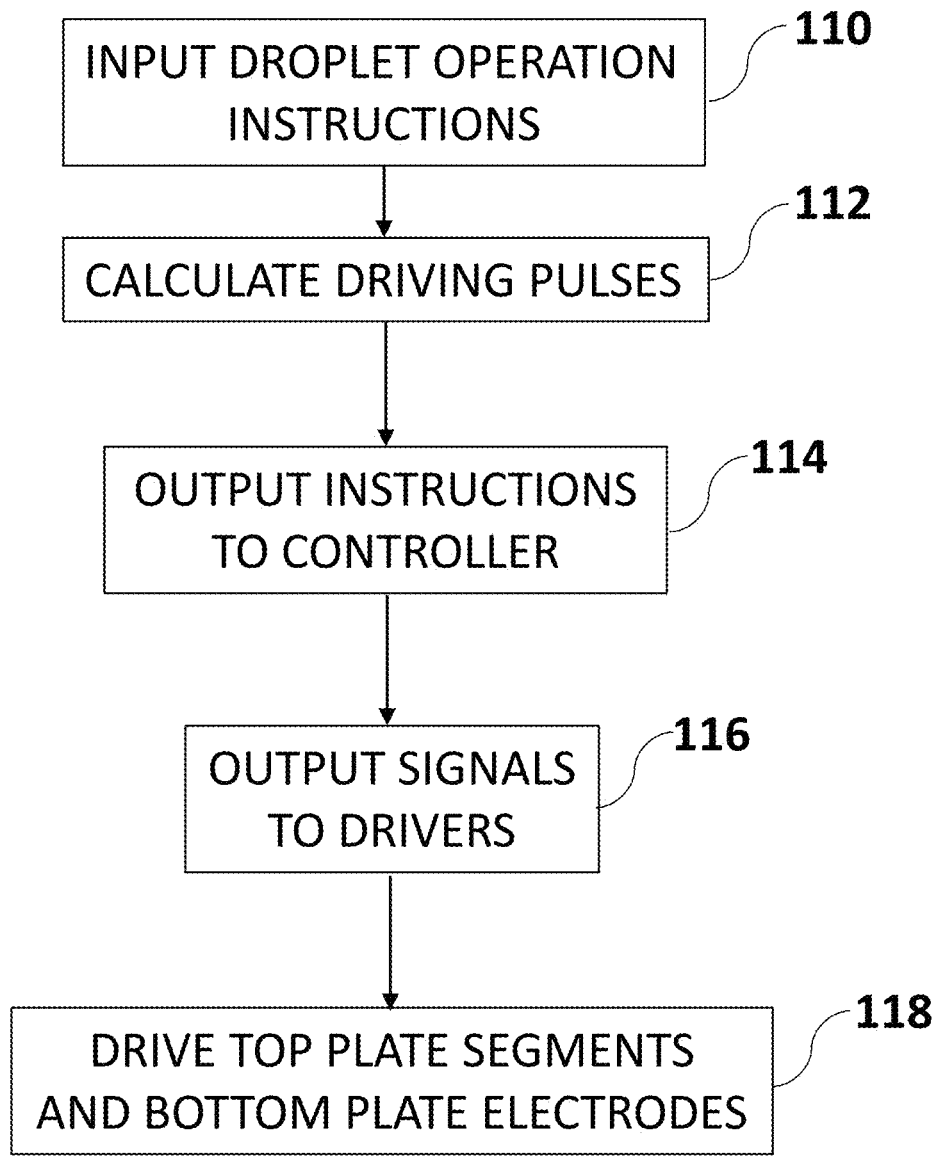
FIG. 11 is a flow chart of a method for implementing a droplet operation on a microfluidic device of the present application.

Electrode driving sequences for specific top plate and bottom plate electrodes can be calculated and implemented based on the requirements of a droplet operation to be performed on the EWoD device. The flow chart of FIG. 11 illustrates an example embodiment of this process. In step 110, a user inputs a desired droplet operation in the form of instructions which are stored in a computer-readable medium that is accessed by a processing unit of the device. The processing unit is programmed to perform driving sequences featuring multiple top electrode potentials. The instructions cause the processing unit to calculate the polarity, frequency, and amplitude of each pulse applied to the top plate segments and bottom plate propulsion electrodes which are to take part in the droplet operation (112). Then, the processing unit outputs instructions to the controller (114), and the controller outputs signals to the drivers of the top plate electrode segments and bottom plate propulsion electrodes (116). In instances where the bottom plate includes an array of TFT electrodes, the controller outputs gate line signals to the drivers of gate lines and data line signals to data line drivers, thereby driving the intended propulsion electrodes. The selected top electrode segments and bottom plate propulsion electrodes are then driven to perform the droplet operation (118).

In an exemplary driving sequence, a first top electrode segment is driven to a first voltage, and a second top electrode segment is driven to a second voltage differing from the first voltage in at least one of polarity, frequency, and amplitude. However, the top plate may include more than two segments, and each segment may be set at a different potential to suit the application at hand. The controller functionality may be provided by a first sub-controller for addressing the top electrode segments and a second sub-controller deputed to driving the bottom plate propulsion electrodes.

From the foregoing, it will be seen that the present invention allows for different voltages to be applied independently across the device, which in turn enables fully turning off pixel zones during top plane operation, thereby reducing strain on driving circuitry. The invention also protects against full failure on potentially very expensive microfluidic cartridges by turning off defective zones. The presence of independent voltage zones increases the functional versatility of digital microfluidic devices, and reduced driving requirements for zones kept in the "off" state, which can potentially comprise large portions of the device, may reduce failure rates. As an added benefit, the present invention makes it possible to mediate dielectric stack density by having the ability to turn off defective zones while not affecting the remainder of the array.

It will be apparent to those skilled in the art that numerous changes and modifications can be made in the specific embodiments of the invention described above without departing from the scope of the invention. Accordingly, the whole of the foregoing description is to be interpreted in an illustrative and not in a limitative sense.

The invention claimed is:

1. A digital microfluidic device, comprising:
   (a) a bottom plate comprising:
   a bottom electrode array comprising a plurality of digital microfluidic propulsion electrodes; and
   a first dielectric layer covering the bottom electrode array;
   (b) a top plate comprising:
   a segmented top electrode array comprising a plurality of separately voltage addressable top electrode segments, wherein each top electrode segment and at least two of the bottom plate propulsion electrodes form a zone within the device;
   a second dielectric layer covering the top electrode array, and
   (c) a controller operatively coupled to the top electrode array and to the bottom electrode array, wherein the controller is configured to provide propulsion voltages between the separately voltage addressable top electrode segments and the plurality of digital microfluidic propulsion electrodes in at least one of the zones;

wherein the top plate and the bottom plate are provided in a spaced relationship defining a microfluidic region there between to permit droplet motion within the microfluidic region under application of propulsion voltages between the separately voltage addressable top electrode segments and the plurality of digital microfluidic propulsion electrodes.

2. The digital microfluidic device of claim 1, wherein the segmented top electrode array includes from at least three to at most ten top separately voltage addressable electrode segments.

3. The digital microfluidic device of claim 1, wherein the device is configured to turn off a zone in the event that the zone becomes inoperable.

4. The digital microfluidic device of claim 3, wherein the device is further configured to turn off the at least one of the zones when the zone reaches a defect density in the bottom electrode array exceeding a predetermined threshold.

5. The digital microfluidic device of claim 1, wherein circuitry for connecting the top electrode array to the bottom electrode array comprises a connection interface.

6. The digital microfluidic device of claim 1, wherein the top plate further comprises a trace layer adjacent the segmented top electrode array, and an insulating layer between the trace layer and the segmented top electrode array, wherein traces on the trace layer are connected to segments of the segmented top electrode array through vias in the insulating layer.

7. The digital microfluidic device of claim 1, wherein the bottom plate further comprises a transistor active matrix backplane, with each transistor of the backplane being operably connected to a gate driver, a data line driver, and one of the digital microfluidic propulsion electrodes.

8. The digital microfluidic device of claim 7, wherein the transistors of the active matrix backplane are thin film transistors (TFT).

9. The digital microfluidic device of claim 1, wherein the bottom plate further comprises a reservoir area and the segmented top electrode array comprises a reservoir segment, wherein the reservoir segment and reservoir area are provided in a spaced relationship defining a reservoir zone.

10. The digital microfluidic device of claim 9, wherein the first dielectric layer comprises a first portion and a second portion, the first portion having a first thickness and covering a portion of the plurality of digital microfluidic propulsion electrodes, the second portion having a second thickness and covering the reservoir area, wherein the second thickness is greater than the first thickness.

11. The digital microfluidic device of claim 1, wherein the controller includes a first sub-controller operably connected to the segmented top electrode array, and a second sub-controller operably connected to the bottom electrode array.

12. The digital microfluidic device of claim 1, wherein each zone comprises at least 10 digital microfluidic propulsion electrodes.

13. A method of driving a digital microfluidic system, the system comprising:
(a) a bottom plate array comprising:
a transistor matrix, wherein each transistor of the matrix is operably connected to a gate line, a data line, and a separate propulsion electrode;
a plurality of gate lines, wherein each gate line is operably connected to a gate driver; and
a plurality of data lines, wherein each data line is operably connected to a data driver;
(b) a segmented top electrode array comprising a plurality of separately voltage addressable top electrode segments,
wherein each separately voltage addressable top electrode and at least two of the propulsion electrodes form a zone within the device;
(c) a plurality of top electrode segment drivers, wherein each driver is configured to separately address a top electrode segment;
(d) a controller operably connected to the gate driver, the data driver, and the top segment drivers;
(e) a processing unit operably connected to the controller and programmed to perform a microfluidic driving method, the method comprising:
receiving input instructions in the processing unit, the input instructions relating to a droplet operation to be performed by the digital microfluidic system;
outputting top electrode segment instructions from the processing unit to the controller;
outputting a top electrode segment signal from the controller to the driver of a first top electrode segment, to drive the first segment to a first voltage differing from the second voltage of a second top electrode segment;
outputting gate line and data line selecting instructions from the processing unit to the controller;
outputting a gate line signal from the controller to the gate driver, to drive the gate line, and
outputting a data line signal from the controller to the data driver, to drive the data line.

14. The method of driving a microfluidic system according to claim 13, wherein the top electrode array includes from at least three to at most ten separately voltage addressable top electrode segments.

15. The method of driving a microfluidic system according to claim 13, wherein a first voltage of a first top electrode segment differs from a second voltage of a second top electrode segment in polarity, frequency, or amplitude.

16. The method of driving a microfluidic system according to claim 13, wherein the second top electrode segment is grounded to a voltage of 0 V.

17. The method of driving a microfluidic system according to claim 13, further comprising turning off a second top electrode segment in the event that a second zone becomes inoperable.

18. The method of driving a microfluidic system according to claim 17, wherein the processing unit is further programmed to turn off the second top electrode segment in the event that a portion of the bottom plate array in the second zone reaches a defect density exceeding a predetermined threshold.

19. The method of driving a microfluidic system according to claim 13, wherein the transistors of the matrix are thin film transistors.

20. The method of driving a microfluidic system according to claim 13, wherein the droplet operation comprises moving a droplet including nucleic acid molecules.

* * * * *